United States Patent
Ma et al.

(10) Patent No.: US 6,682,954 B1
(45) Date of Patent: Jan. 27, 2004

(54) METHOD FOR EMPLOYING PIGGYBACK MULTIPLE DIE

(76) Inventors: Manny Kin F. Ma, Boise, ID (US); Jeffrey D. Bruce, Boise, ID (US)

( * ) Notice: Subject to any disclaimer, the term of this patent is extended or adjusted under 35 U.S.C. 154(b) by 1035 days.

(21) Appl. No.: 08/791,177

(22) Filed: Jan. 31, 1997

Related U.S. Application Data (62) Division of application No. 08/654,725, filed on May 29, 1996, now abandoned.

(51) Int. Cl.[7] .............................................. H01L 21/44
(52) U.S. Cl. ...................................... 438/109; 438/123
(58) Field of Search ................................ 257/692, 723, 257/777, 784, 686, 666, 670, 672, 674, 678, 735; 361/813; 438/108, 118, 123, 613, 614, FOR 368, 786, 724, 109

(56) References Cited

U.S. PATENT DOCUMENTS

| | | | |
|---|---|---|---|
| 5,012,323 A | 4/1991 | Farnworth | 257/723 |
| 5,049,979 A * | 9/1991 | Hashemi et al. | |
| 5,128,831 A | 7/1992 | Fox, III et al. | 361/396 |
| 5,291,061 A | 3/1994 | Ball | 257/686 |
| 5,323,060 A | 6/1994 | Fogal et al. | 257/777 |
| 5,331,235 A | 7/1994 | Chun | 257/777 |
| 5,365,409 A | 11/1994 | Kwon et al. | 361/813 |
| 5,422,435 A | 6/1995 | Takiar et al. | 174/52.4 |
| 5,434,745 A | 7/1995 | Shokrgozar et al. | 361/735 |
| 5,438,224 A | 8/1995 | Papageorge et al. | 257/777 |
| 5,455,445 A | 10/1995 | Kurtz et al. | 257/419 |
| 5,581,498 A | 12/1996 | Ludwig et al. | 365/63 |
| 5,608,262 A | 3/1997 | Degani et al. | 257/723 |
| 5,625,235 A | 4/1997 | Takiar | 257/776 |
| 5,644,167 A | 7/1997 | Weiler et al. | 257/777 |
| 5,930,599 A * | 7/1999 | Fujimoto et al. | 438/113 |

FOREIGN PATENT DOCUMENTS

| JP | 56-158467 | * | 7/1981 |
|---|---|---|---|
| JP | 56-158467 | | 12/1981 |
| JP | 58-54646 | * | 3/1983 |
| JP | 63-104343 | * | 5/1988 |
| JP | 1-44024 | * | 2/1989 |
| JP | 3-165550 | * | 7/1991 |

OTHER PUBLICATIONS

"Tape Automated Bonded Chip on MCM–D", IEEE/CHMT Int'l Electronics Manufacturing TechnologySymposium, pp. 282–297, 1993.*
"A Low–Cost Multichip (MCM–L) Packaging Solution", IEEE/CHMT Int'l Electronics Manufacturing Technology Symposium, pp. 464–470, 1993.*
"Leaded Multichip Module Connector", IEEE, 1992.*
"electronic Packaging in the 1990's —A Perspective From Asia", IEEE Transactions on Components, Hybrid, and Manufacturing Technology, vol. 14, No. 2, pp. 254–261, Jun. 1991.*

* cited by examiner

Primary Examiner—David L. Talbott
Assistant Examiner—Alonzo Chambliss (57) ABSTRACT

A method for upgrading or remediating semiconductor devices utilizing a remediation, adaptation, modification or upgrade chip in a piggyback configuration with a primary bare chip to achieve an upgrade, modification or adaptation of the primary chip or remedy a design or fabrication problem with the primary chip.

9 Claims, 7 Drawing Sheets

METHOD FOR EMPLOYING PIGGYBACK MULTIPLE DIE

CROSS-REFERENCE TO RELATED APPLICATION

This is a application is a divisional of application Ser. No. 08/654,725, filed May 29, 1996, abandoned.

BACKGROUND OF THE INVENTION

1. Field of the Invention

The present invention relates to an apparatus and a method for upgrading or remediating semiconductor devices. In particular, the present invention relates to utilizing a remediation, modification or upgrade chip or other component in a piggyback configuration with an existing bare chip assembly to achieve an upgrade, modify chip operating parameters or remedy a design or fabrication problem.

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board or similar carrier substrate, including flip chip attachment, wirebonding, and tape automated bonding ("TAB"). COB also references the resulting end product.

Flip Chip: A chip or die that has a pattern or array of terminations spaced around the active surface of the die for face down mounting of the die to a substrate.

Flip Chip Attachment: A method of attaching a semiconductor die to a substrate in which the die is inverted so that the connecting conductor pads on the face of the device are set on mirror-image pads on the substrate (such as a printed circuit board) and generally bonded by solder reflux or a conductive polymer curing.

Glob Top: A glob of encapsulant material (usually epoxy or silicone or a combination thereof) surrounding a semiconductor die in a COB assembly.

PGA—Pin Grid Array: An array of small pins extending substantially perpendicularly from the major plane of a semiconductor die, wherein the pins conform to a specific arrangement on a printed circuit board or other substrate for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

TAB—Tape Automated Bonding: A conductor placement structure wherein conductive traces preformed on a dielectric film or flexible sheet, such as a polyimide, are used to electrically connect bond pads of a semiconductor die to conductors of a carrier such as a leadframe or printed circuit board.

State-of-the-art COB technology generally consists of three semiconductor die-to-printed circuit board conductive attachment techniques: flip chip attachment, wirebonding, and TAB.

Flip chip COB attachment consists of attaching a semiconductor die, generally having a BGA, a SLICC or PGA, to a printed circuit board. With the BGA or SLICC, the solder or other conductive ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. In all of the foregoing techniques, insulative underfill encapsulant is generally disposed between the semiconductor die and the printed circuit board for environmental protection and to enhance the attachment of the die to the board.

Wirebonding and TAB attachment to produce a COB generally begin with attaching a semiconductor die to the surface of a printed circuit board with an appropriate adhesive, such as an epoxy. In wirebonding, a plurality of bond wires is extended and attached, one at a time, between each bond pad on the semiconductor die and a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. With TAB, ends of metal traces carried on an insulating tape or film such as a polyimide are respectively gang-bonded using thermocompression techniques to the bond pads on the semiconductor die and to the lead or trace ends on the printed circuit board. An encapsulant is generally subsequently applied over the die and attendant the bond wires to prevent contamination or any physical damage to the assembly.

During a production run of an integrated circuit, a design parameter may change or a design or fabrication error may be detected in one or more circuits of a semiconductor chip. When such occur, the semiconductor chips of that production run may have to be scrapped if not exhibiting at least minimum performance characteristics. Although it may be possible to remediate the semiconductor chips with the addition of an adjacent chip or other circuit on the board, increased miniaturization of components and the boards to which they are mounted, as well as greater packaging density of integrated circuit assemblies, reduces or eliminates the potential space or "real estate" on the board upon which to locate remediation or upgrade circuitry or chips. Further, in many instances, it would be desirable to employ semiconductor dice in circuits for which they were not initially designed or intended, such as employing a die having a lower voltage requirement in a circuit providing a higher voltage power input. Such adaptability of dice to various operating environments may be significant, and even critical, during cycles in the industry wherein certain components are in short supply and others might be substituted if a viable technique for doing so existed.

U.S. Pat. No. 5,012,323 issued Apr. 30,.1991, to Farnworth teaches combining a pair of dice mounted on opposing sides of a leadframe. An upper, smaller die is back-bonded to the upper surface of the leads of the leadframe via a first adhesively coated, insulated film layer. A lower, larger die is face-bonded to the lower leadframe die bonding region via a second, adhesively coated, insulative, film layer. The wirebonding pads on both the upper die and lower die are interconnected with the ends of their associated lead extensions with gold or aluminum bond wires. The lower die must be slightly larger than the upper die in order that the die pads are accessible from above through a bonding window in the leadframe such that gold wire connections can be made to the lead extensions.

U.S. Pat. No. 5,128,831 issued Jul. 7, 1992, to Fox et al. teaches vertically stacked die, each in a sub-module, the sub-modules connected by solder-filled vias and the assembly connected to a board through a PGA.

U.S. Pat. No. 5,291,061 issued Mar. 1, 1994, to Ball teaches a multiple stacked die device containing up to four stacked die supported on a dice attach paddle of a leadframe, the assembly not exceeding the height of then-current single die packages, and wherein the bond pads of each die are wirebonded to lead fingers. The low profile of the device is achieved by close-tolerance stacking which is made possible by a low-loop-profile wirebonding operation and thin, adhesive layers between the stacked dice.

U.S. Pat. No. 5,323,060 issued Jun. 21, 1994, to Fogal et al. teaches a multichip module that contains stacked die devices, the terminals or bond pads of which are wirebonded to a substrate or to adjacent die devices.

U.S. Pat. No. 5,422,435 to Takiar et al. teaches dice stacked to form a multi-chip module (CM) and having wire bonds extending to each other and to the leads of a conductor-bearing carrier member such as a -leadframe.

U.S. Pat. No. 5,434,745 issued Jul. 18, 1995, to Shokrgozar et al. teaches a structure similar to that of Fox et al. with stacked sub-modules electrically connected at their peripheries by a conductive epoxy.

U.S. Pat. No. 5,438,224 issued Aug. 1, 1995, to Papageorge et al. teaches a multi-die assembly employing face-to-face dice connected to an interposed TAB tape or flex circuit, which in turn is connected to an underlying board.

U.S. Pat. No. 5,455,445 issued Oct. 3, 1995, to Kurtz et al. teaches an MCM of vertically stacked dice employing vias extending through the semiconductor material of the die substrates for vertical electrical interconnection.

All of the above mentioned patents relate to increasing conductor-bearing integrated circuit density. However, none of these patents deal with remediating, modifying or upgrading semiconductors and semiconductor assemblies.

Therefore, it would be advantageous to develop a technique and assembly for remediating, adapting, modifying or upgrading semiconductor die assemblies using remediation, adaptation, modification or upgrade chips in combination with commercially available, widely practiced semiconductor device fabrication techniques.

SUMMARY OF THE INVENTION

The present invention relates to an apparatus and a method for upgrading, adapting, modifying or remediating semiconductor devices utilizing a remediation or upgrade chip in a piggyback configuration with an existing bare chip assembly to achieve an upgrade, adapt to an assembly, modify an operating parameter or remedy a design or fabrication problem.

As mentioned above, during a production run of an integrated circuit, a design parameter may change, a design or fabrication error may be detected in a semiconductor chip or the like. When such problems are encountered, the semiconductor chips of that production run might normally be scrapped. Although it may be possible to remediate such a semiconductor chip with the addition of a circuit to the board on which the chip resides, increased miniaturization of boards and cards and greater packaging density of integrated circuits eliminates the potential space or "real estate" upon which to locate remediation or upgrade circuitry or chips.

Further, it may be desirable to upgrade an unflawed but obsolete chip design while a new design is being developed and introduced so as to maintain market share and serve customer needs.

In addition, the viability of adapting chips to operating environments, such as power sources for which a particular chip is not designed, is extremely desirable, especially during periodic component shortages. One specific example would be use of a regulator to enable a 3.3 V pail to access a 5 V system. Another example of an operating environment adaptation would be the addition of an output driver to strengthen a chip's signal output to a circuit which would not respond to the chip's original signal.

The present invention solves the real estate problem by mounting the remediation chip on a face surface of the original chip (the term "remediation" or "remediating" will be used for purposes of this application to mean either remediating the original die to fix an error, adapting the original die to meet at least one changed design or operating parameter, upgrading the original die with additional circuitry, or the like).

The basic assembly of the present invention comprises an original or primary die with a patch or remediation die adhered thereto. The patch die is attached to the primary die by a layer of adhesive. The adhesive is preferably an electrically insulative adhesive, as required or desired, to electrically isolate the primary die from the patch die. Depending on the adhesive, the assembly might be "cured" to affix the dice together. It is, of course, understood that other types of adhesives, such as a pressure sensitive adhesive or a tape segment carrying the same, could be used to hold the dice together.

Generally, both the primary die and patch die have a plurality of bond pads. The dice are attached such that the bond pads of each face in a common direction. A substrate with leads or a plurality of lead fingers from a leadframe extend toward the primary die (the term "substrate" will be used for purposes of this application to mean either a substrate carrying traces or other conductors or a leadframe). The substrate conductors may make electrical contact with the bond pads on the patch die or primary die. Generally, the electrical contact is made with a plurality of bond wires. However, the electrical contact could be made with TAB connections, lead fingers in a leads-over-hip (LOC) or even a leads-between-chip (LBC) connection configuration or the like. A second electrical connection is made between the patch die and the primary die. The second electrical connection can likewise be made with bond wires or TAB connections. However, the second electrical connection can also comprise a lower bond pad (actually a via) disposed on the adhesion surface or back side of the patch die. A flip chip electrical connect, such as solder or a conductive polymer, achieves an electrical connection between the lower patch die bond pad or via end, and the primary die bond pad.

The patch die may receive an output signal from the primary die, or receive an input signal from or provide an output signal to the substrate trace or leadframe. The circuitry in the patch die remediates, modifies, adapts or performs upgrade functions and outputs the corrected or modified signal to the primary die or a substrate conductor or lead finger (depending on the input).

A glob top or dammed encapsulant may be applied over the entire assembly to protect same from contamination and physical damage. After application of the glob top or other encapsulant, the primary die, for all intents and purposes, is indistinguishable, both physically and in performance, from a die designed from the outset to exhibit the modified and desired characteristics of the assembly.

Another embodiment comprises a patch die which may span the width and/or length of the primary die. In this embodiment, the patch die has a plurality of first bond pads on a patch die face surface, preferably in the approximate position of the primary die bond pads. The patch die further includes a plurality of lower bond pads (via ends) on a patch die back side. A flip chip type electrical connect, such as solder, a conductive polymer or a conductor-loaded polymer, achieves an electrical connection between the lower bond pads and the primary die bond pads. The substrate conductors or lead fingers extend toward the primary die and are connected to their respective bond pads on a face surface of the patch die with a plurality of bond wires. The remediation, adaptation, modification or upgrade is achieved with the patch die. As previously discussed, the patch die either receives an output signal from the original die or an input signal from the substrate or lead finger. The circuitry in the patch die remediates, adapts, modifies or performs upgrade functions and outputs the corrected signal to the original die or the substrate lead or lead finger (depending on the input).

Yet another embodiment of the present invention comprises the use of multiple interacting patch dice either separately attached to the original die or stacked atop one another. Multiple patch die assemblies are necessary when a single chip cannot by itself provide all of the circuitry required for remediation or where the amount of real estate on a primary die will not allow for a single large patch die.

In the multiple stacked assembly, a lower patch die is attached to the original die with a first layer of adhesive. A back surface of an upper patch die is attached to a face surface of the lower patch die with a second layer of adhesive. A plurality of bond wires makes electrical contact between the substrate leads or lead fingers and a plurality of bond pads on an upper patch die face surface of at least one of the patch dice. A plurality of upper-to-lower patch die bond wires makes electrical contact between a plurality of bond pads on the upper patch die face surface and a plurality of respective die bond pads on the lower patch die face surface. A plurality of stack-to-primary die bond wires makes electrical contact between a plurality of bond pads of at least one of the patch dice and a plurality of primary die bond pads.

In the separately attached multiple die assembly, multiple patch dice are each attached directly atop the original die. The patch dice electrically interact with one another, as well as the primary die, and in connection with the substrate or leadframe in the manner discussed above to achieve remediation of the original die.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
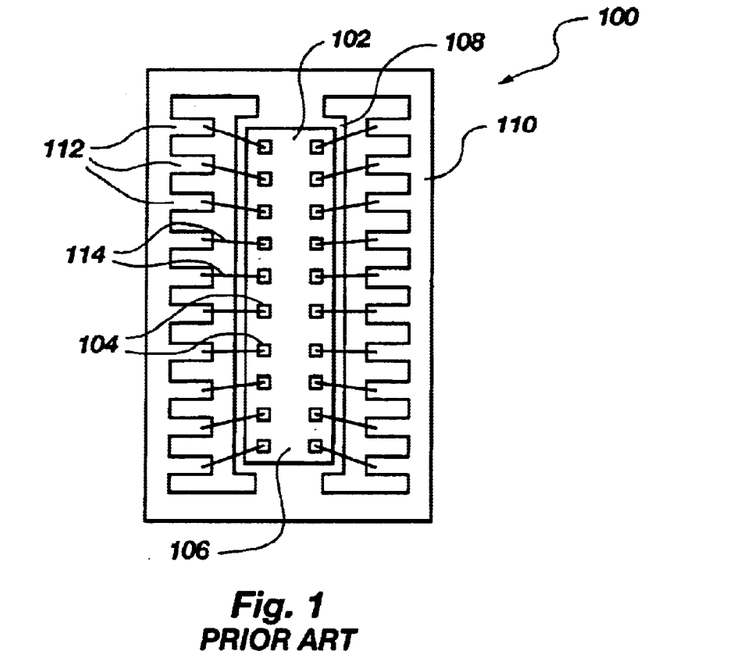
FIG. 1 is a top plan view of a prior art wire bond/leadframe semiconductor assembly.

FIG. 1 illustrates a prior art wirebonded bare die assembly 100. The assembly 100 comprises a semiconductor die 102 having a plurality of bond pads 104 on an upper surface 106 of the semiconductor die 102. The semiconductor die 102 is conventionally mounted by its back side (not shown) on a leadframe paddle 108 of leadframe 110. The leadframe 110 further includes a plurality of lead fingers 112 which extend toward the semiconductor die 102. The semiconductor die 102 achieves an electrical connection with the leadframe 110 with a plurality of bond wires 114 connected between each bond pad 104 and its respective lead finger 112.

Figure 2:
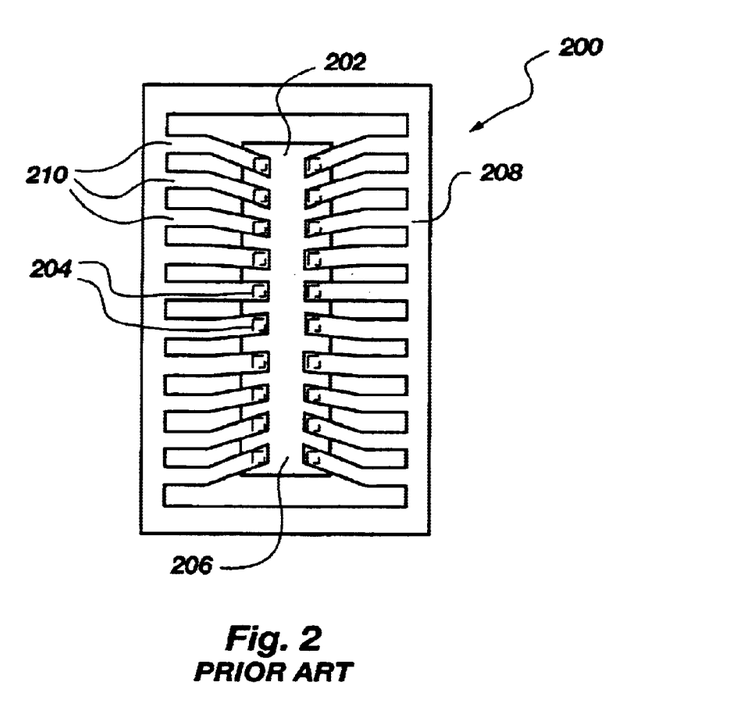
FIG. 2 is a top plan view of a prior art leads over chip semiconductor assembly.

FIG. 2 illustrates a prior art leads-over-chip (LOC) bare die assembly 200. The assembly 200 comprises a semiconductor die 202 having a plurality of bond pads 204 (shown in shadow lines) on an upper surface 206 of the semiconductor die 202. The semiconductor die 202 is electrically connected to a leadframe 208 though a plurality of lead fingers 210, each of which extends over the die upper surface 206 to either directly electrically contact and attach to its respective bond pad 204 (as with thermocompression bonding) or through bond wires if lead fingers 210 terminate short of bond pads 204. The former approach is illustrated.

Figure 3:
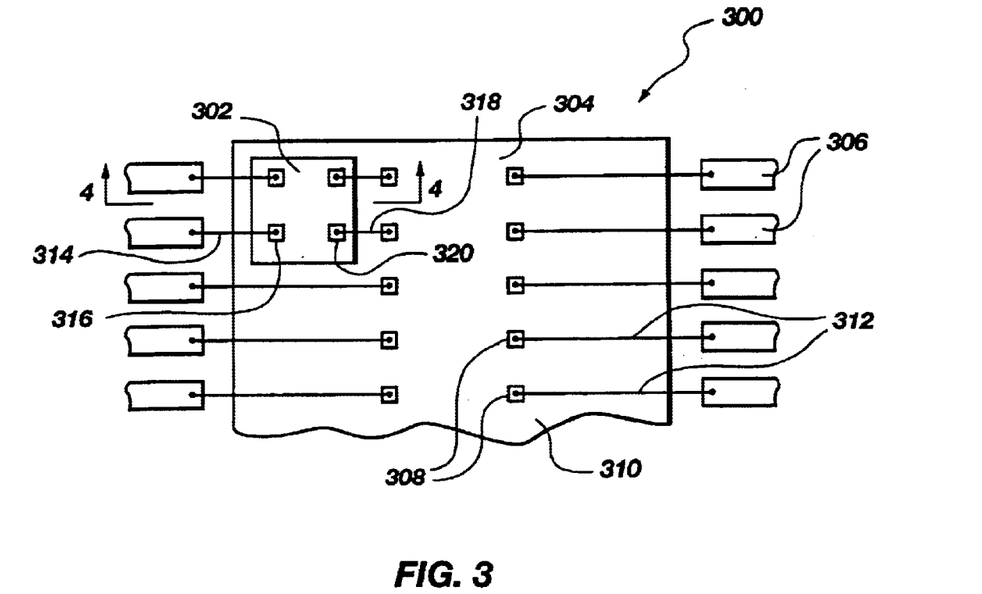
FIG. 3 is a top plan view of a preferred assembly of the present invention.

FIG. 3 illustrates a bare die assembly 300 of the present invention. The assembly 300 comprises a patch die 302 atop a primary die 304. A plurality of leads from a substrate (not shown) or a plurality of lead fingers 306 from a leadframe (remainder not shown) extends toward the primary die 304 and is individually attached to its respective bond pads 308 on a face surface 310 of the primary die 304 with a plurality of bond wires 312. The remediation, adaptation, modification or upgrade is achieved with the patch die 302.

Figure 4:
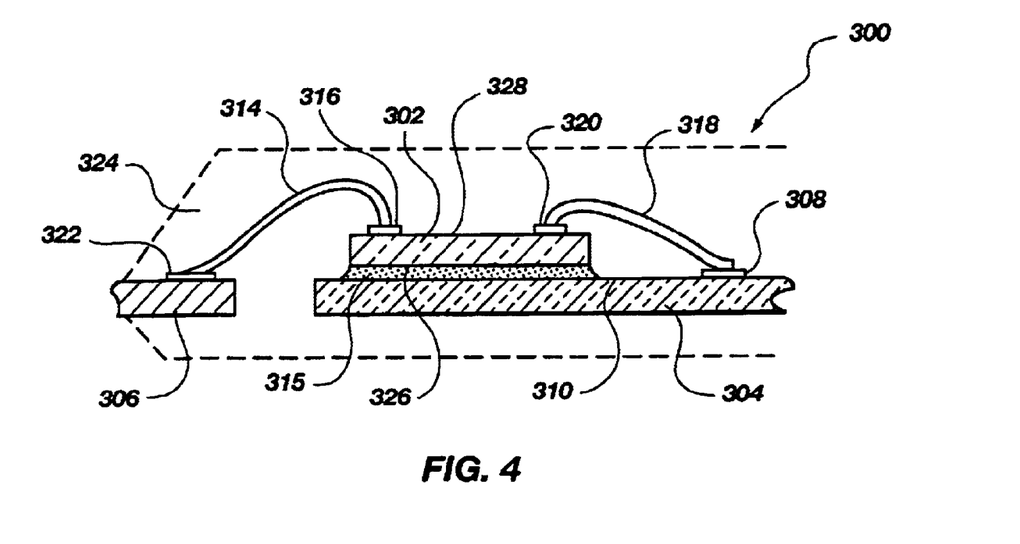
FIG. 4 is a side cross-sectional view of the assembly of FIG. 3 along line 4—4.

FIG. 4 illustrates the mechanical and electrical attachment of the patch die 302 in a cross-sectional view along line 4—4 of FIG. 3. Components common to both FIGS. 3 and 4 retain the same numeric designation. The patch die 302 is attached to the primary die 304 with a layer of adhesive 315 disposed between a patch die back side 326 and primary die face surface 310. At least one first patch bond wire 314 makes electrical contact between at least one appropriate substrate lead or lead finger 306 and at least one first patch bond pad 316 on patch die face surface 328. At least one second patch bond wire 318 makes electrical contact between at least one second patch bond pad 320 on the patch die face surface 328 and at least one respective primary die bond pad 308. Thus, the patch die 302 either receives an output signal from the primary die 304 and outputs to one or more lead fingers 306, or receives an input signal from the substrate or lead finger 306 and outputs to primary die 304. The circuitry in the patch die 302 remediates, adapts, modifies or performs upgrade functions and outputs the corrected signal to the primary die 304 or the substrate lead or lead finger 306 (depending on the input). It is also possible and contemplated as within the scope of the invention, that patch die 302 receives an input from, and in turn outputs to, primary die 304. FIG. 4 differs from FIG. 3 in the fact that element 306 is shown as a substrate (rather than a lead finger) with a substrate trace 322 to which the first patch bond wire 314 is connected.

A glob top 324 or other encapsulating structure may be applied over the assembly 300 individually, as shown in broken lines, or over the entire substrate (remainder not shown), which may support a plurality of assemblies 300. The subsequently described embodiments may similarly be glob-topped, as desired.

Figure 5:
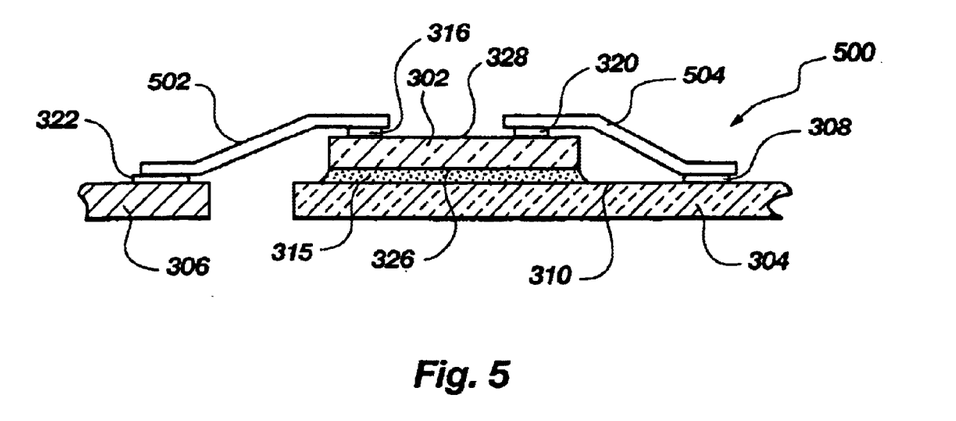
FIG. 5 is a side cross-sectional view of an alternate assembly.

FIG. 5 illustrates an alternative connection assembly 500 for the patch die 302. The assembly 500 of FIG. 5 is similar to the assembly 300 of FIG. 4; to a therefore, components common to both FIGS. 4 and 5 retain the same numeric designation. FIG. 5 differs from FIG. 4 only in the electrical attachment of the patch die 302. FIG. 5 illustrates a TAB connection 502 for electrical communication between the substrate trace 322 and the first patch bond pad 316 on the patch die face surface 328 and a TAB connection 504 between the second patch bond pad 320 on the patch die face surface 328 and the primary die bond pad 308. It is, of course, understood that a combination of bond wires and TAB connections could be used to make the required electrical connections.

Figure 6:
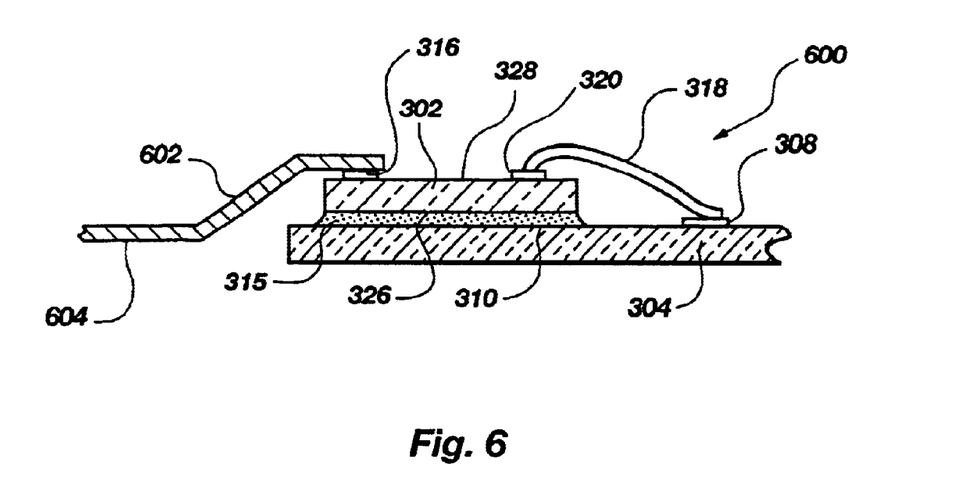
FIG. 6 is a side cross-sectional view of another alternate assembly.

FIG. 6 illustrates another alternative connection assembly 600 of the patch die 302. The assembly 600 of FIG. 6 is similar to the assembly 300 of FIG. 4, to therefore, components common to both FIGS. 4 and 6 retain the same numeric designation. FIG. 6 differs from FIG. 4 only in the electrical attachment of the patch die 302. FIG. 6 illustrates an LOC thermocompression connection of lead finger 602 of leadframe 604 which extends over, is attached to, and makes electrical contact with the first patch bond pad 316 on the patch die face surface 328 (similar to prior art FIG. 2). The second patch bond wire 318 achieves electrical communication between the second patch bond pad 320 on the patch die face surface 328 and the primary die bond pad 308. It is, of course, understood that a TAB connection could be used to make the electrical connections between the second patch bond pad 320 and the primary die bond pad 308.

Figure 7:
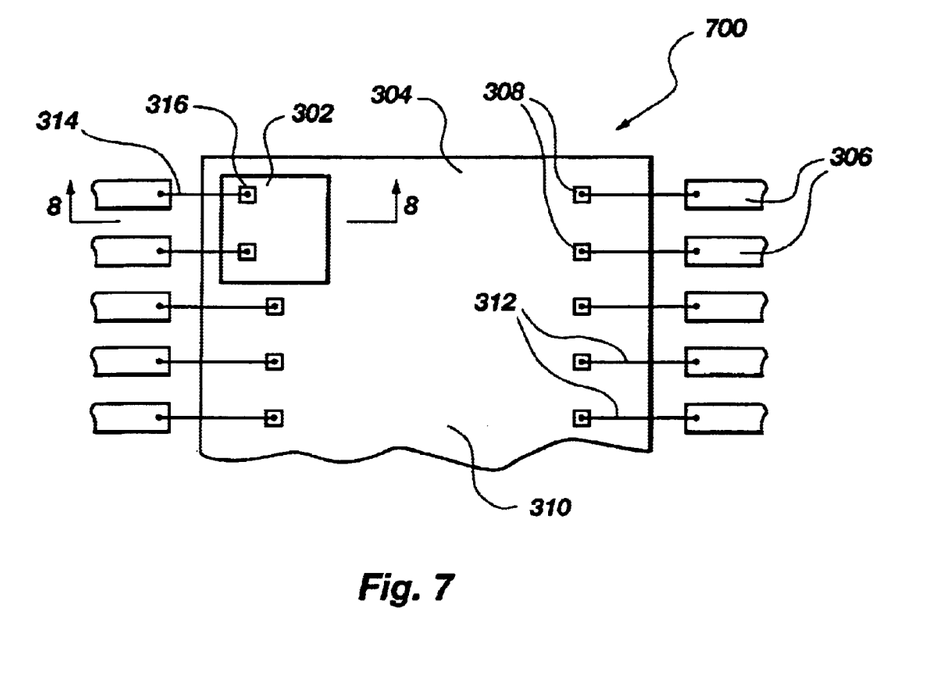
FIG. 7 is a top plan view of another preferred assembly of the present invention.

FIG. 7 illustrates another bare die assembly 700 of the present invention. The assembly 700 of FIG. 7 is similar to the assembly 300 of FIG. 3, therefore, components common to both FIGS. 3 and 7 retain the same numeric designation. The assembly 700 comprises the patch die 302 atop the primary die 304. The substrate with leads (not shown) or the plurality of lead fingers 306 from the leadframe (remainder not shown) extends toward the primary die 304 and is attached to its respective bond pads 308 on the face surface 310 of the primary die 304 with the plurality of bond wires 312 (similar to the configuration shown in prior art FIG. 1). The remediation, adaptation, modification or upgrade is achieved with the patch die 302.

Figure 8:
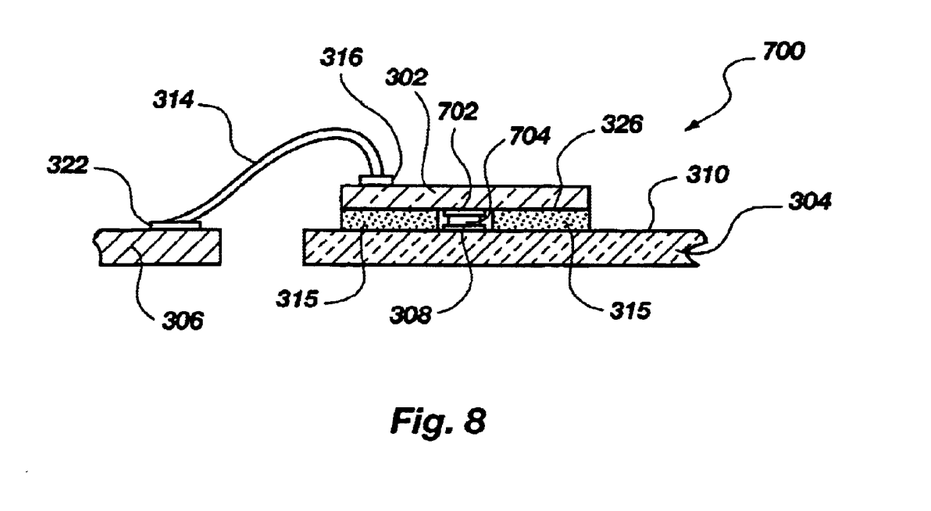
FIG. 8 is a side cross-sectional view of the assembly of FIG. 7 along line 8—8.

FIG. 8 illustrates the electrical connection of the patch die 302 to primary die 304 in a cross-sectional view along line 8—8 of FIG. 7. Components common to both FIGS. 7 and 8 retain the same numeric designation. The patch die 302 is attached to the primary die 304 with a layer of adhesive 315. At least one first patch bond wire 314 makes electrical contact between at least one appropriate substrate lead or lead finger 306 and at least one first patch bond pad 316 of the patch die 302. A lower bond pad or via base 702 is disposed on the patch die back side 326. An electrical connect 704, such as solder or a conductive polymer, achieves an electrical connection between the lower bond pad or via base 702 and the primary die bond pad 308.

As previously discussed, the patch die 302 may receive an output signal from the primary die 304 or an input signal from the substrate or lead finger 306 or both. The circuitry in the patch die 302 remediates, adapts, modifies or performs upgrade functions and outputs the corrected signal to the primary die 304 or the substrate lead or lead finger 306 (depending on the input). FIG. 8 differs from FIG. 7 in the fact that the component 306 is shown as a substrate (rather than a lead finger) with the substrate trace 322 to which the first patch bond wire 314 is connected.

Figure 9:
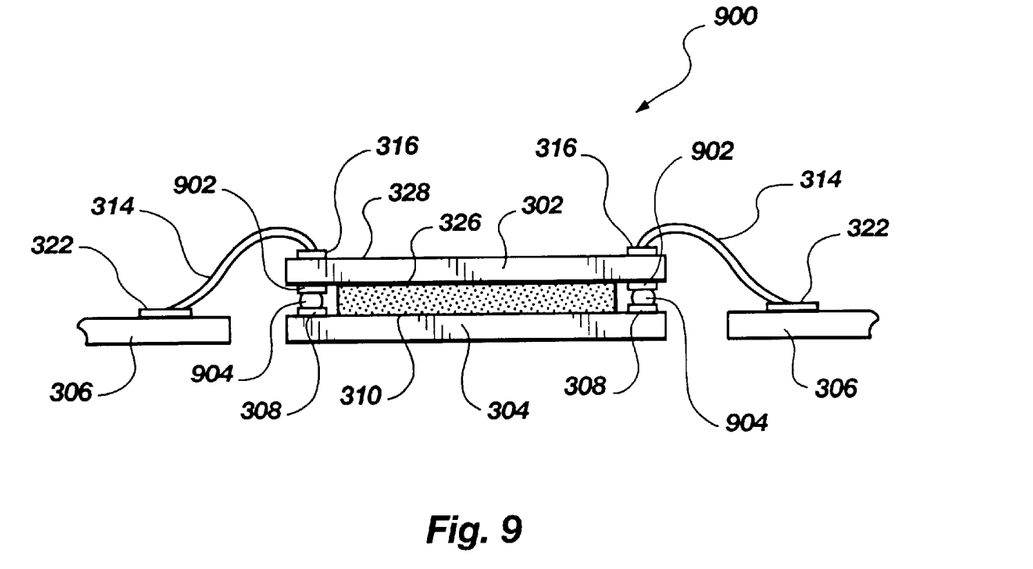
FIG. 9 is a side plan view of yet another alternate assembly of the present invention.

FIG. 9 illustrates a side plan view of yet another alternate bare die assembly 900 of the present invention. The assembly 900 of FIG. 9 is similar to the assembly 300 of FIG. 4; therefore, components common to both FIGS. 4 and 9 retain the same numeric designation. The assembly 900 comprises the patch die 302 atop the primary die 304. In this embodiment, the patch die 302 spans the width of the primary die 304. The patch die 302 has the first patch bond pads 316 disposed on the patch die face surface 328, preferably in the approximate position of the primary die bond pads 308. The patch die 302 further includes a plurality of lower bond pads or via bases 902 disposed on the patch die back side 326. Electrical connects 904, such as solder or a conductive polymer, achieve electrical connections between the lower bond pads 902 and the primary die bond pads 308.

The substrate carrying conductors or a leadframe with lead fingers 306 extends toward the primary die 304. The conductors (lead fingers 306 or substrate traces 322) are attached to their respective first patch bond pads 316 on the face surface 328 of the patch die 302 with the plurality of first patch bond wires 314. The remediation, adaptation, modification or upgrade is achieved with the patch die 302. As previously, the patch die 302 may receive an output signal from the primary die 304, an input signal from the substrate or lead finger 306 or both. The circuitry in the patch die 302 remediates, adapts, modifies or performs upgrade functions and outputs the corrected signal to the primary die 304 or the substrate lead or lead finger 306 (depending on the input).

Figure 10:
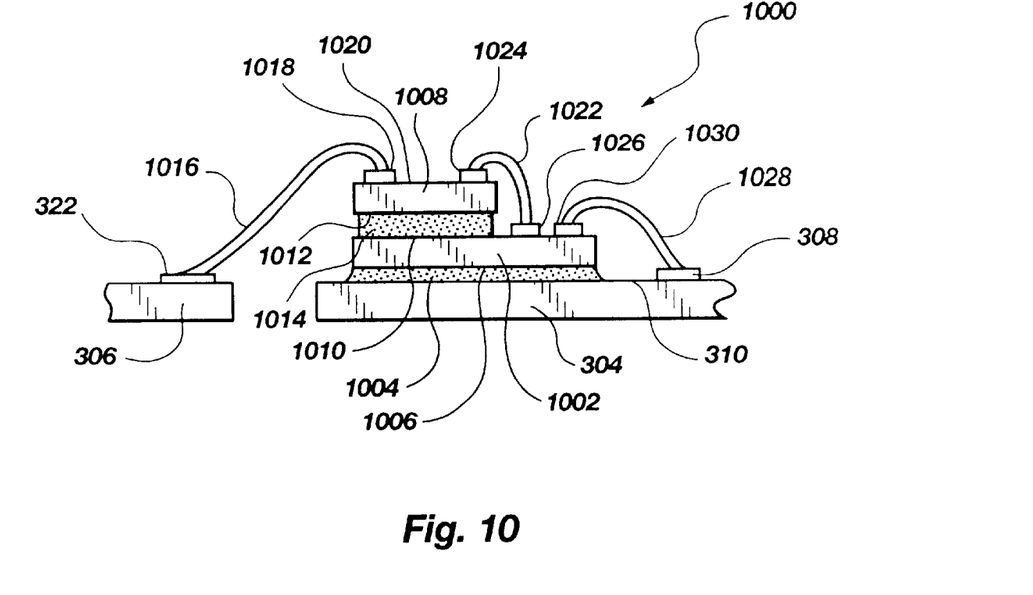
FIG. 10 is a side plan view of a multiple patch die assembly of the present invention.

FIG. 10 illustrate a side plan view of a multiple stacked bare die assembly 1000 of the present invention. The assembly 1000 of FIG. 10 is similar to the assembly 300 of FIG. 4; therefore, components common to both FIGS. 4 and 10 retain the same numeric designation. The assembly 1000 comprises a lower patch die 1002 atop the primary die 304. The lower patch die 1002 is attached to the primary die 304 with a first layer of adhesive 1004 disposed between a lower patch die back side 1006 and the primary die face surface 310. A back surface 1012 of an upper patch die 1008 is attached to a face surface 1010 of the lower patch die 1002 with a second layer of adhesive 1014.

At least one substrate-to-upper patch die bond wire 1016 makes electrical contact between at least one appropriate substrate lead or lead finger 306 and at least one first upper die bond pad 1018 on an upper patch die face surface 1020. At least one upper-to-lower die bond wire 1022 makes electrical contact between at least one second upper die bond pad 1024 on the upper patch die face surface 1020 and at least one respective first lower die bond pad 1026 on the lower patch die face surface 1010. At least one lower-toprimary die bond wire 1028 makes electrical contact between at least one second lower bond pad 1030 and at least one primary die bond pad 308.

Thus, the lower patch die 1002 receives an input signal from the primary die 304 which is initially remediated. The initially remediated signal is sent to the upper patch die 1008 wherein a second stage of remediation is done before outputting the corrected signal to the substrate or lead finger 306. Alternatively, the upper patch die 1008 receives an input signal from the substrate or lead finger 306 which is initially remediated and the initially remediated signal is sent to the lower patch die 1002 wherein a second remediation is done before outputting the corrected signal to the primary die 304.

Figure 11:
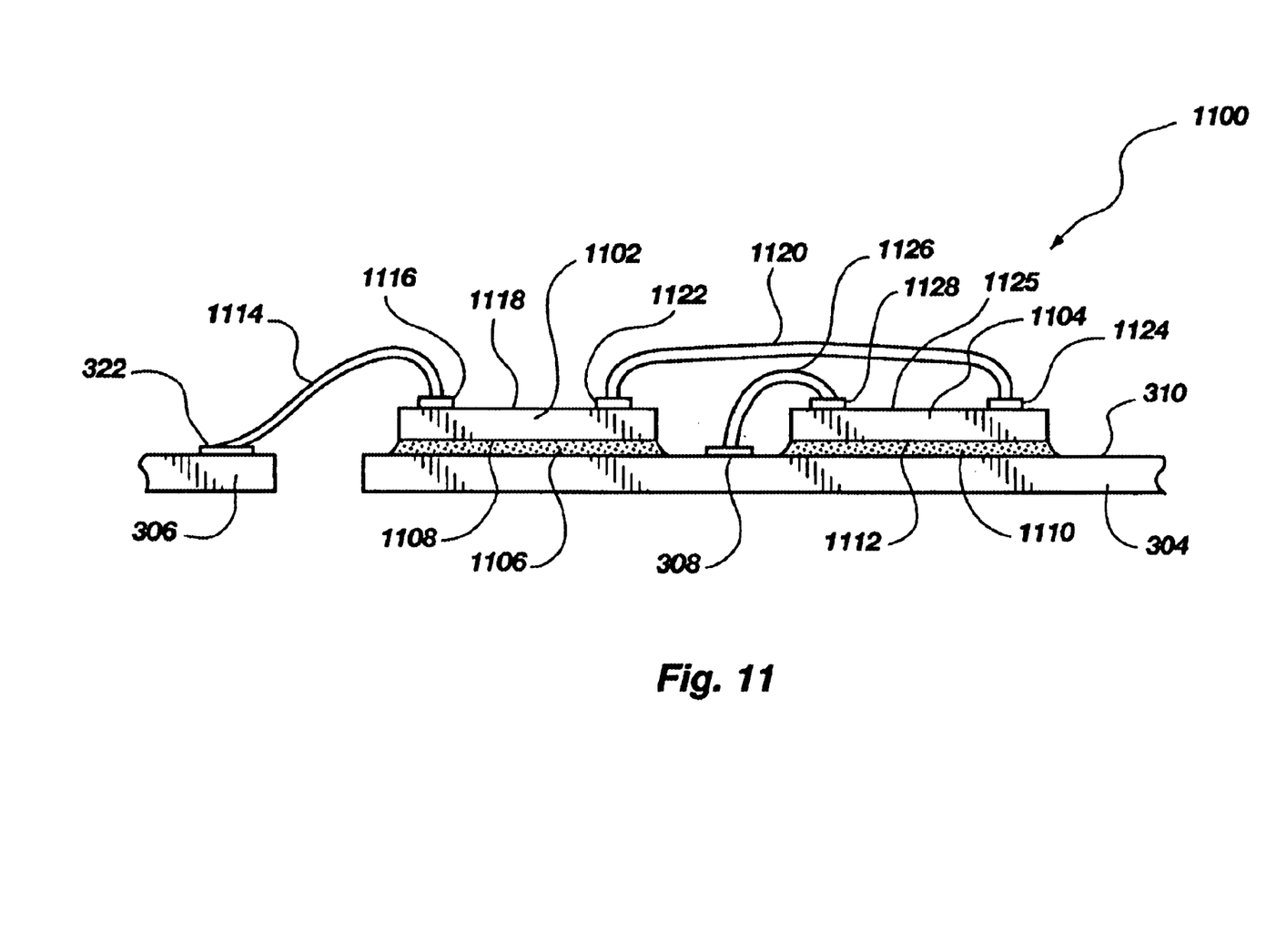
FIG. 11 is a side plan view of an alternative multiple patch die assembly of the present invention.

FIG. 11 illustrates a side plan view of a multiple bare die assembly 1100 of the present invention. The assembly 1100 of FIG. 11 is similar to the assembly 300 of FIG. 4; therefore, components common to both FIGS. 4 and 11 retain the same numeric designation. The assembly 1100 comprises a first patch die 1102 and a second patch die 1104 both atop the primary die 304. The first patch die 1102 is attached to the primary die 304 with a first layer of adhesive 1106 disposed between a first patch die back side 1108 and the primary die face surface 310. The second patch die 1104 is also attached to the primary die 304 with a second layer of adhesive 1110 disposed between a second patch die back side 1112 and primary die face surface 310.

At least one substrate-to-first patch die bond wire 1114 makes electrical contact between at least one appropriate substrate lead or lead finger 306 and at least one first patch die first bond pad 1116 on a first patch die face surface 1118. At least one first-to-second die bond wire 1120 makes electrical contact between at least one first patch die second bond pad 1122 on the first patch die face surface 1118 and at least one respective second patch die first bond pad 1124 on the second patch die face surface 1125. At least one second patch die-to-primary die bond wire 1126 makes electrical contact between at least one second patch die second bond pad 1128 and at least one primary die bond pad 308.

Thus, the second patch die 1104 receives an input signal from the primary die 304 which is initially remediated and the initially remediated signal is sent to the first patch die 1102 wherein a second remediation is done before outputting the corrected signal to the substrate or lead finger 306. Alternately, the first patch die 1102 receives an input signal from the substrate or lead finger 306, which signal is initially remediated, and the initially remediated signal is sent to the second patch die 1104 wherein the second remediation is done before outputting the corrected signal to the primary die 304.

Figure 12:
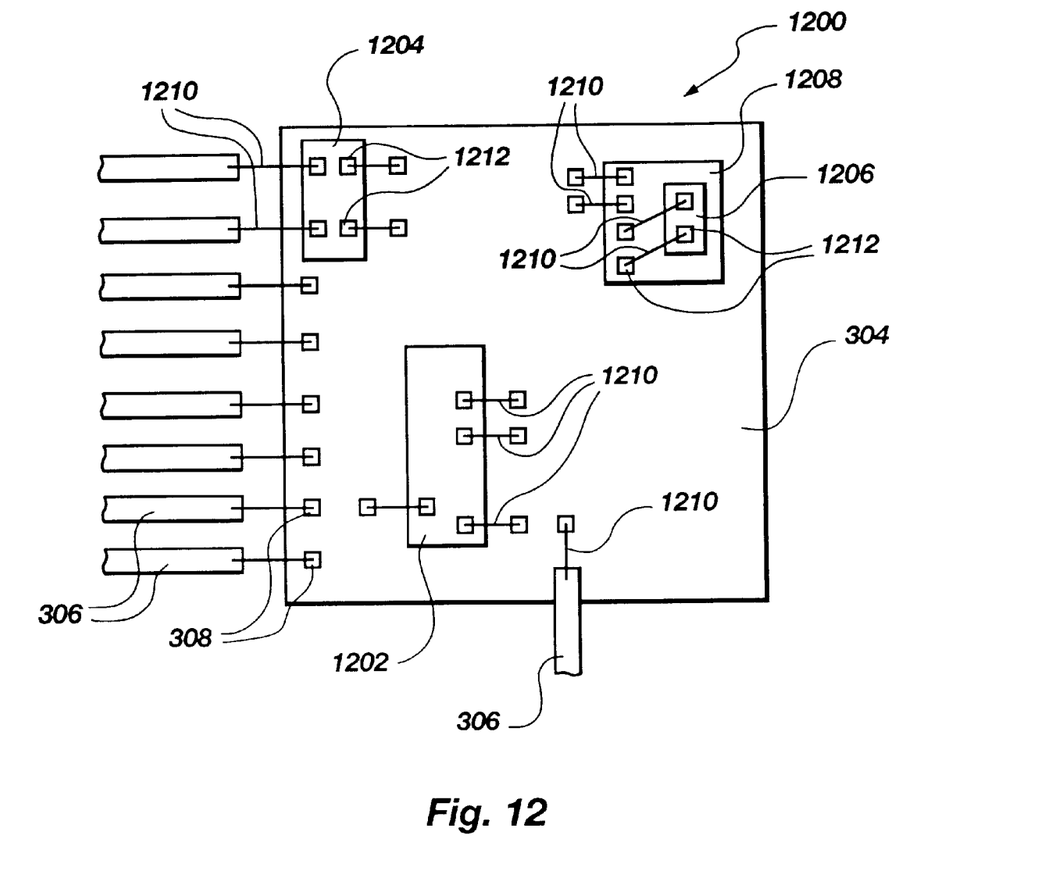
FIG. 12 is a top plan view of yet another alternative multiple patch die assembly of the present invention.

FIG. 12 depicts a previously referenced but unillustrated embodiment 1200 of the invention, wherein a first patch die 1202 interacts solely with primary die 304, while a second patch die 1204 serves as an intermediary between primary die 304 and certain conductors (e.g., lead fingers 306). Reference numerals employed in FIG. 12 correspond to those previously employed in FIGS. 3, and 4 to identify similar elements. Exemplary bond wires are identified as 1210, and bond pads of patch dice as 1212. Of course, multiple stacked patch dice could also be employed on primary die 304 so that three, four or even more additional dice, might be mounted to primary die 304, as required. Further, two or more stacked or co-planar patch die 1206, 1208 might only communicate with the primary die and not with external circuitry.

It is, of course, understood that a multitude of die configurations can be devised using the teachings this disclosure.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of assembling a semiconductor die device comprising:
    providing a primary die exhibiting at least one electrical or operational characteristic;
    mounting at least one patch die on said primary die for altering said at least one electrical or operational characteristic of said primary die;
    forming an electrical contact between said at least one patch die and said primary die;
    providing at least one lead finger extending from at least one leadframe;
    providing at least one bond pad on a face surface of said at least one patch die;
    extending said at least one lead finger over said at least one patch die face surface bond pad; and
    forming an electrical connection between said at least one lead finger and said at least one patch die including directly attaching said at least one lead finger to said at least one patch die face surface bond pad.

2. The method of claim 1, further comprising providing at least one bond pad on said primary die and providing at least one other bond pad on a face surface of said at least one patch die.

3. The method of claim 2, further comprising connecting at least one bond wire between said at least one primary die bond pad and said at least one other patch die face surface bond pad to form said electrical contact between said at least one patch die and said primary die.

4. The method of claim 2, further comprising attaching at least one patch-to-primary die TAB connection between said at least one primary die bond pad and said at least one other patch die face surface bond pad to form said electrical contact between said at least one patch die and said primary die.

5. The method of claim 2, further comprising providing at least one bond pad on a back surface of said at least one patch die.

6. The method of claim 5, further comprising forming at least one electrical connection between said at least one primary die bond pad and said at least one patch die back surface bond pad.

7. The method of claim 1 further comprising:
    providing at least one other patch die for altering said at least one electrical or operational characteristic of said primary die; and
    forming an electrical connection between said at least one other patch die and at least one of said at least one patch die and said primary die.

8. The method of claim 7, further comprising mounting said at least one other patch die to said at least one patch die.

9. The method of claim 7, further comprising mounting said at least one other patch die to said primary die.

* * * * *